US009508907B2

(12) United States Patent
Lawrence et al.

(10) Patent No.: US 9,508,907 B2
(45) Date of Patent: Nov. 29, 2016

(54) LIGHT EMITTING DEVICE ON A MOUNT WITH A REFLECTIVE LAYER

(71) Applicant: KONINKLIJKE PHILIPS N.V., Eindhoven (NL)

(72) Inventors: Nathaniel T. Lawrence, San Jose, CA (US); Oleg Shchekin, San Jose, CA (US); Kenneth Vampola, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/853,102

(22) Filed: Sep. 14, 2015

(65) Prior Publication Data

US 2016/0079498 A1   Mar. 17, 2016

Related U.S. Application Data

(60) Provisional application No. 62/050,481, filed on Sep. 15, 2014.

(51) Int. Cl.

| H01L 33/00 | (2010.01) |
|---|---|
| H01L 33/60 | (2010.01) |
| H01L 33/48 | (2010.01) |
| H01L 33/58 | (2010.01) |
| H01L 33/50 | (2010.01) |
| H01L 33/54 | (2010.01) |

(52) U.S. Cl.
CPC ............. *H01L 33/60* (2013.01); *H01L 33/486* (2013.01); *H01L 33/502* (2013.01); *H01L 33/54* (2013.01); *H01L 33/58* (2013.01)

(58) Field of Classification Search
CPC ..... H01L 33/60; H01L 33/486; H01L 33/58; H01L 33/502
See application file for complete search history.

(56) References Cited

U.S. PATENT DOCUMENTS

| 2002/0180351 | A1* | 12/2002 | McNulty | ................ | B82Y 20/00 |
|---|---|---|---|---|---|
| | | | | | 313/512 |
| 2012/0019123 | A1* | 1/2012 | Furukawa | ............... | H01L 33/54 |
| | | | | | 313/483 |
| 2013/0056776 | A1* | 3/2013 | Su | ........................... | H01L 33/60 |
| | | | | | 257/98 |
| 2013/0146841 | A1* | 6/2013 | Yun | ......................... | H01L 33/04 |
| | | | | | 257/13 |
| 2015/0054011 | A1* | 2/2015 | Koizumi | ............... | H01L 33/505 |
| | | | | | 257/98 |
| 2015/0287762 | A1* | 10/2015 | Chae | ...................... | H01L 33/38 |
| | | | | | 362/97.1 |
| 2016/0087174 | A1* | 3/2016 | Bhat | ...................... | H01L 33/58 |
| | | | | | 438/29 |

FOREIGN PATENT DOCUMENTS

| EP | 2482346 A1 | 8/2012 |
|---|---|---|
| KR | 101428774 B1 | 8/2014 |

OTHER PUBLICATIONS

EPO as ISA, PCT/US15/50206 filed Sep. 15, 2015, "International Search Report and Written Opinion", mailed Nov. 18, 2015, 10 pages.

* cited by examiner

*Primary Examiner* — Victor A Mandala

(57) ABSTRACT

Embodiments of the invention include a semiconductor light emitting diode (LED) attached to a top surface of a mount. A multi-layer reflector is disposed on the top surface of the mount adjacent to the LED. The multi-layer reflector includes layer pairs of alternating layers of low index of refraction material and high index of refraction material. A portion of the top surface in direct contact with the multi-layer reflector is non-reflective.

18 Claims, 1 Drawing Sheet

1

LIGHT EMITTING DEVICE ON A MOUNT WITH A REFLECTIVE LAYER

FIELD OF THE INVENTION

The present invention relates to a light emitting device disposed on a mount with a reflective layer disposed next to the light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a packaged phosphor-converted light emitting device described in more detail in U.S. Pat. No. 8,680,556. FIG. 2 illustrates the composite reflective layer of FIG. 1 in more detail. The device of FIG. 1 includes an LED 302 disposed on package 300 and covered by an encapsulant 304 that includes phosphor. Light emitted out of the LEDs 302, light emitted from phosphors in the encapsulant 304, and light which reflects off of the exit surface of the encapsulant 304 may be emitted towards the substrate 300. At least a portion of this light is reflected off a composite layer 362 and redirected so that it can exit the package.

FIG. 2 shows one possible configuration of a reflective composite layer 362. In this configuration, a set of dielectric layers 308 is formed over a set of metal layers. The portion of the dielectric layers 308 adjacent to the metal layer 310 may be an adhesion layer 312. The portion of metal layer 310 adjacent to the substrate 300 may also be an adhesion layer 312. In the embodiments described in U.S. Pat. No. 8,680,556, the material in the composite layer closest to substrate 300 is silver.

SUMMARY

It is an object of the invention to provide an LED disposed on a mount with a reflective layer disposed next to the LED on the mount.

Embodiments of the invention include a semiconductor light emitting diode (LED) attached to a top surface of a mount. A multi-layer reflector is disposed on the top surface of the mount adjacent to the LED. The multi-layer reflector includes layer pairs of alternating layers of low index of refraction material and high index of refraction material. A portion of the top surface in direct contact with the multi-layer reflector is non-reflective.

Embodiments of the invention include a semiconductor light emitting diode (LED) attached to a top surface of a mount. A layer is disposed on the top surface of the mount adjacent to the LED. A lens is disposed over the LED and the layer. The layer has an index of refraction lower than the index of refraction of the lens.

DETAILED DESCRIPTION

Figure 1:
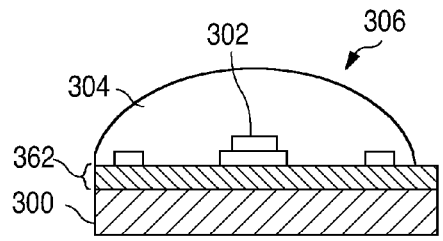
FIG. 1 is a cross sectional view of a prior art packaged LED with a reflective package surface.
Figure 2:
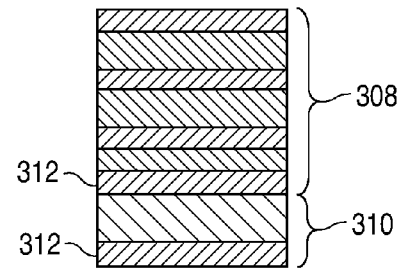
FIG. 2 is a cross sectional view of one example of a reflective surface in the device of FIG. 1.
Figure 3:
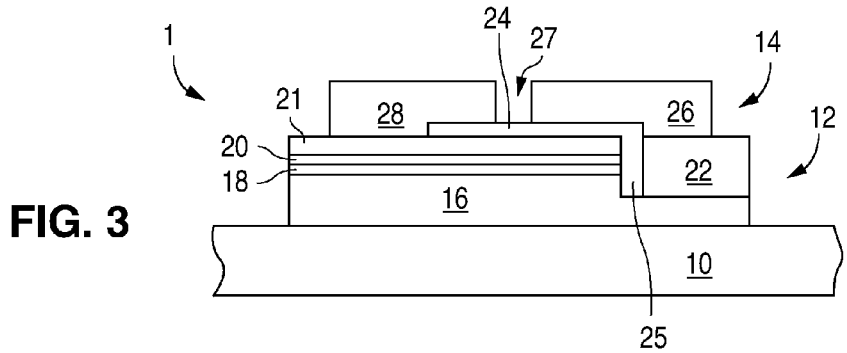
FIG. 3 is a cross sectional view of one example of an LED.

In embodiments of the invention, a lighting device such as a semiconductor light emitting diode is disposed on a package with at least one reflective layer. FIG. 3 illustrates one example of a III-nitride LED. Any suitable semiconductor light emitting device may be used and embodiments of the invention are not limited to the LED illustrated in FIG. 3.

In the device of FIG. 3, a majority of light is extracted from the LED through the growth substrate. Such a device may be referred to as a flip chip device. The LED of FIG. 3 is formed by growing a III-nitride semiconductor structure on a growth substrate 10 as is known in the art. The growth substrate is often sapphire but may be any suitable substrate such as, for example, a non-III-nitride material, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by bather layers. A p-type region 20 may then be grown over the light emitting region. Like the n-type region, the p-type region may include multiple layers of different composition, thickness, and dopant concentration, including layers that are not intentionally doped, or n-type layers.

After growth of the semiconductor structure, a reflective p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 3. The n- and p-contacts may be redistributed to form bond pads with a dielectric/metal stack, as is known in the art.

In order to electrically and physically attach the LED to another structure, one or more interconnects 26 and 28 are formed on or electrically connected to the n- and p-contacts 22 and 21. Interconnect 26 is electrically connected to n-contact 22 in FIG. 3. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure. Many individual LEDs are formed on a single wafer then diced from the wafer of devices. The substrate 10 may be thinned after growth of the semiconductor structure or after forming the individual devices. In some embodiments, the substrate is removed from the device of FIG. 3. A majority of light extracted from the device of FIG. 3 is extracted through the substrate 10 (or the surface of the semiconductor structure exposed by removing the substrate 10).

FIGS. 4, 5, 6, and 7 illustrate packaged LEDs, with different reflective layers formed on the mount. In each of FIGS. 4, 5, 6, and 7, an LED 1 is electrically and physically connected to the top surface 42 of a mount 40.

The LED 1 may be electrically connected to electrically conductive structures 44 formed on the surface 42. The electrically conductive structures 44 are typically metal pads. The metal pads may be substantially the same size as the LED 1, as illustrated in, for example, FIG. 4, or may cover all or a portion of the top surface 42 that is not covered by LED 1, as illustrated in, for example, FIG. 5. The metal pads 44 electrically connect to bonding pads (not shown in the figures) formed, for example, on the top surface 42, or on the bottom surface of the mount 40. Bonding pads on the bottom surface of mount 40 may connect to the metal pads 44 for example through vias, not shown, formed within the mount or through any other suitable structure.

The mount 40 may be, for example, a ceramic structure, a plastic structure, a metal structure with one or more electrical isolation layers, a lead frame, or any other suitable structure.

In each of FIGS. 4, 5, 6, and 7, a transparent cover 46 is disposed over LED 1 and mount 40. The cover 46 is often, as illustrated in 4, 5, 6, and 7, an optic such as a dome lens, a Fresnel lens, or any other suitable structure. In some embodiments, the cover 46 is simply a conformal, transparent sheet of material. The cover 46 may be formed separately from the LED and mount and attached by gluing or any other suitable technique, or formed in situ, for example by laminating, molding, or any other suitable process. In some embodiments, one or more materials are mixed with the transparent material that forms the cover 46. Examples of suitable materials mixed with the transparent material include one or more wavelength converting materials such as powder phosphors, materials to adjust the index of refraction, particles that cause scattering, or any other suitable material.

In each of FIGS. 4, 5, 6, and 7, all or a portion of the top surface 42 of mount 40 that is not covered by LED 1 is covered by one or more reflective layers. The reflective layers may prevent light from being absorbed by the mount 40, or may reduce the amount of light absorbed by the mount 40, by reflecting unconverted light emitted by the LED 1 and/or converted light emitted by a phosphor in cover 46. The reflective layers may increase extraction from the cover 46, which may increase the efficiency of the device.

Figure 4:
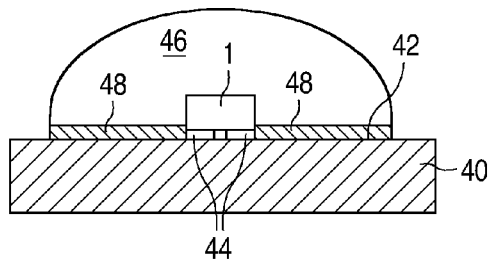
FIG. 4 is a cross sectional view of an LED disposed on a mount with a multi-layer reflector in direct contact with the mount.
Figure 5:
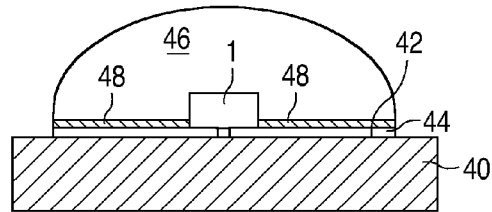
FIG. 5 is a cross sectional view of an LED disposed on a mount with a multi-layer reflector in direct contact with conductive pads on the mount.

In FIGS. 4 and 5, a multi-layer reflector 48 is disposed on the top surface 42 of the mount 40. The multi-layer reflector may be, for example, multiple layer pairs of alternating layers of high index and low index materials. The low index material may have a refractive index of at least 1.2 in some embodiments and no more than 1.6 in some embodiments. The high index material may have a refractive index of at least 2 in some embodiments and no more than 3 in some embodiments. The low index material may be $SiO_2$ or any other suitable material. The high index material may be $TiO_2$, $Ta_2O_5$, or any other suitable material.

The multi-layer reflector may be a distributed Bragg reflector (DBR). Any suitable number of layer pairs may be used; at least 2 pairs in some embodiments, no more than 50 layer pairs in some embodiments, at least 5 pairs in some embodiments, not more than 40 pairs in some embodiments, and not more than 12 pairs in some embodiments. The total thickness of the DBR is at least 100 nm in some embodiments, not more than 2 µm in some embodiments, at least 500 nm in some embodiments, and no more than 5 µm in some embodiments. In some embodiments, one or more layers in a DBR is a polymer.

In the device of FIG. 4, the metal pads 44 are confined to an area that is substantially the same size as LED 1, such that multi-layer reflector 48 is disposed on and in direct contact with the top surface 42 of mount 40. In some embodiments, the top surface 42 of mount 40 may be a surface that is not reflective. In the device of FIG. 5, the metal pads cover a portion of the top surface 42 larger than the footprint of LED 1, such that the multi-layer reflector 48 is disposed on and in direct contact with the metal pads 44. The metal pads may be metals that are substantially not reflective of light emitted by LED 1. Examples of such non-reflective metals include Cu, Al, Au, combinations thereof, or any other suitable metal or conductive material.

Figure 6:
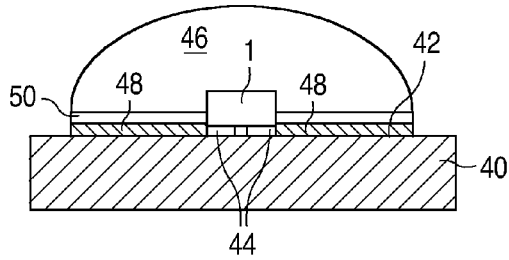
FIG. 6 is a cross sectional view of an LED disposed on a mount with a multi-layer reflector and a low index layer.

In FIG. 6, a multi-layer reflector 48 is combined with a low index layer 50. The multi-layer reflector 48, which may be any of the multi-layer reflectors described above in the text accompanying FIGS. 4 and 5, is disposed in direct contact with the top surface 42, as illustrated, or in direct contact with metal pads 44, as illustrated in FIG. 5. A low index layer 50 is formed over multi-layer reflector 48, such that multi-layer reflector 48 is disposed between the mount 40 and the low index layer 50.

The low index layer 50 may be a material with an index of refraction less than 1.4 in some embodiments, no more than 1.3 in some embodiments, no more than 1.2 in some embodiments, and at least 1.1 in some embodiments. In some embodiments, the low index material 50 is air, which typically has an index of refraction of 1. At the interface between the low index layer 50 and the cover 46, the contrast in index of refraction between these two layers may cause at least some light incident on the interface to be reflected by total internal reflection. The cover 46 is often silicone, which generally has an index of refraction between 1.4 and 1.6. Materials may be added to the silicone forming cover 46, in order to increase the index of refraction of cover 46, which would increase the contrast between the low index layer and the cover, which may increase the amount of light that is reflected. For example, the index of refraction of cover 46 may be at least 1.5 in some embodiments, at least 1.8 in some embodiments, at least 2 in some embodiments, and no more than 2.5 in some embodiments.

Suitable low index materials include low index glasses such as MgF or other fluoride glasses, low index polymers, and porous materials such as porous $SiO_2$. The low index material may be formed by any suitable process. A porous or other low index material may be deposited using, for example, a sol gel process.

Figure 7:
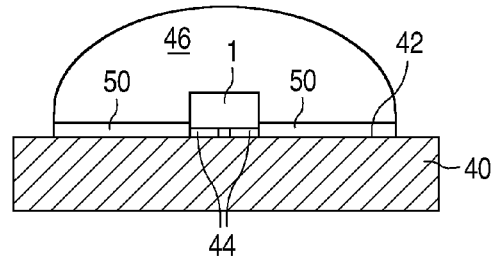
FIG. 7 is a cross sectional view of an LED disposed on a mount with a low index layer.

In FIG. 7, a low index layer 50 is used without a multi-layer reflector. The low index layer 50 may be any of the low index layers described above in the text accompanying FIG. 6, may be disposed in direct contact with the top surface 42, as illustrated, or in direct contact with metal pads 44, as illustrated in FIG. 5.

The reflective layers illustrated in FIGS. 4, 5, 6, and 7 may be formed by any suitable technique. For example, the reflective layers may be formed after the LED 1 is attached to the mount and before the cover is formed/attached, for example by masking the LED 1 or otherwise preventing the reflective layer from being formed on LED 1. The reflective layers may be formed before LED 1 is attached to the mount. The reflective layers may be not formed in the area where LED 1 will later be placed, for example by selective growth or any other suitable technique, or altered to form an opening where LED 1 will be placed, for example by conventional photolithography techniques. There may be a gap between LED 1 and the reflective layers, or the LED 1 and the reflective layers may be positioned with no gap, as illustrated in FIGS. 4, 5, 6, and 7. The top surface of the reflective layers may be at the same elevation as the top surface of LED 1, or the top surface of the reflective layers may be higher or lower than the top surface of LED 1.

In some embodiments, more than one LED may be disposed on a mount with reflective layers. In some embodiments, devices other than LEDs are disposed on a mount with reflective layers.

Though in the examples above the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Having described the invention in detail, those skilled in the art will appreciate that, given the present disclosure, modifications may be made to the invention without departing from the spirit of the inventive concept described herein. For example, any of the features described in any of the embodiments described herein may be included in or omitted from any of the embodiments described herein. Therefore, it is not intended that the scope of the invention be limited to the specific embodiments illustrated and described.

The invention claimed is:
1. A device comprising:
   a semiconductor light emitting diode (LED) attached to a top surface of a mount; and
   a multi-layer reflector disposed on the top surface of the mount adjacent to the LED, the multi-layer reflector comprising layer pairs of alternating layers of low index of refraction material and high index of refraction material;
   a lens disposed over the LED and the multi-layer reflector; and
   a layer disposed between the multi-layer reflector and the lens, wherein the layer has an index of refraction lower than the index of refraction of the lens;
   wherein a portion of the top surface in direct contact with the multi-layer reflector is non-reflective.

2. The device of claim 1 wherein the portion of the top surface in direct contact with the multi-layer reflector is a metal.

3. The device of claim 1 wherein the portion of the top surface in direct contact with the multi-layer reflector is one of ceramic, plastic, and lead frame.

4. The device of claim 1 wherein the layer has an index of refraction no more than 1.3.

5. The device of claim 1 wherein the layer is selected from the group consisting of glass, fluoride glass, MgF, porous material, and porous $SiO_2$.

6. The device of claim 1 further comprising a wavelength converting material disposed in the lens.

7. The device of claim 1 wherein the multi-layer reflector comprises at least one polymer layer.

8. A device comprising:
   a semiconductor light emitting diode (LED) attached to a top surface of a mount;
   a layer disposed on the top surface of the mount adjacent to the LED; and
   a lens disposed over the LED and the layer, wherein the layer has an index of refraction lower than the index of refraction of the lens;
   wherein a top surface of the LED is in direct contact with the lens.

9. The device of claim 8 wherein the layer has an index of refraction no more than 1.3 and the lens has an index of refraction of at least 1.4.

10. The device of claim 8 wherein the layer is selected from the group consisting of glass, fluoride glass, MgF, porous material, and porous $SiO_2$.

11. The device of claim 8 wherein the layer is in direct contact with both the mount and the lens.

12. The device of claim 8 wherein a portion of the top surface of the mount in direct contact with the layer is non-reflective.

13. The device of claim 8, wherein a height of a top surface of the layer is less than a height of the top surface of the LED.

14. A device comprising:
   a semiconductor light emitting diode (LED) attached to metal pads disposed on a top surface of a mount; and
   a multi-layer reflector disposed in direct contact with the top surface of the mount adjacent to the metal pads, the multi-layer reflector comprising layer pairs of alternating layers of low index of refraction material and high index of refraction material;
   wherein a portion of the top surface of the mount in direct contact with the multi-layer reflector is non-reflective.

15. The device of claim 14 wherein the portion of the top surface of the mount in direct contact with the multi-layer reflector is one of ceramic, plastic, and lead frame.

16. The device of claim 14 further comprising a cover disposed over the LED and the multi-layer reflector.

17. The device of claim 16 further comprising a wavelength converting material disposed in the cover.

18. The device of claim 14 wherein the multi-layer reflector comprises at least one polymer layer.

* * * * *